(12) United States Patent
Zhang (10) Patent No.: US 9,154,124 B2
(45) Date of Patent: Oct. 6, 2015

(54) ELECTROMAGNETIC RADIATION DISSIPATING DEVICES

(75) Inventor: Yongshan Zhang, San Jose, CA (US)

(73) Assignee: FINISAR CORPORATION, Sunnyvale, CA (US)

(*) Notice: Subject to any disclaimer, the term of this patent is extended or adjusted under 35 U.S.C. 154(b) by 757 days.

(21) Appl. No.: 13/360,033

(22) Filed: Jan. 27, 2012

(65) Prior Publication Data

US 2013/0194000 A1 Aug. 1, 2013

(51) Int. Cl.
- *H04B 3/28* (2006.01)
- *H03K 17/16* (2006.01)
- *G02B 6/42* (2006.01)
- *H04B 10/25* (2013.01)
- *H03H 1/00* (2006.01)
- *H03H 7/01* (2006.01)

(52) U.S. Cl.
CPC .............. *H03K 17/16* (2013.01); *G02B 6/4246* (2013.01); *G02B 6/4277* (2013.01); *H04B 10/2504* (2013.01); *G02B 6/4292* (2013.01); *H03H 2007/013* (2013.01)

(58) Field of Classification Search
CPC ...... H03K 17/16; H04B 10/2507; H04B 3/28; H03H 1/0007
USPC ....................... 333/12, 172; 359/249
See application file for complete search history.

(56) References Cited

U.S. PATENT DOCUMENTS

| | | | |
|---|---|---|---|
| 6,157,547 A * | 12/2000 | Brown et al. | 361/818 |
| 6,307,442 B1 * | 10/2001 | Meyer et al. | 333/17.1 |
| 6,590,691 B1 * | 7/2003 | Nagra et al. | 359/237 |
| 7,589,604 B2 * | 9/2009 | Ninan et al. | 333/174 |
| 7,646,264 B2 * | 1/2010 | Petrovic | 333/176 |
| 7,649,407 B2 * | 1/2010 | Rohani et al. | 327/553 |
| 7,660,562 B2 * | 2/2010 | Onno et al. | 455/114.1 |
| 2007/0035355 A1 * | 2/2007 | Chao et al. | 333/12 |
| 2010/0079211 A1 * | 4/2010 | Matsuda et al. | 330/306 |

* cited by examiner

*Primary Examiner* — Dean Takaoka
*Assistant Examiner* — Alan Wong
(74) *Attorney, Agent, or Firm* — Maschoff Brennan (57) ABSTRACT

Electromagnetic radiation ("EMR") dissipating devices. One example embodiment includes an electrical circuit including an EMR source configured to generate an output signal at an operating bit rate. The output signal may include an EMR component. The electrical circuit may also include an EMR dissipating device electrically coupled to the EMR source and configured to have a resonance frequency corresponding to the operating bit rate.

18 Claims, 7 Drawing Sheets

ELECTROMAGNETIC RADIATION DISSIPATING DEVICES

BACKGROUND

1. Field of the Invention

Embodiments described herein relate generally to electromagnetic radiation ("EMR") control in communication modules. More particularly, example embodiments relate to EMR dissipating devices that may contain and/or dissipate EMR introduced into an electrical circuit.

2. Related Technology

Communication modules, such as electronic or optoelectronic transceivers or transponder modules, are increasingly used in electronic and optoelectronic communication. Communication modules often include electronic components and electronic circuitry that may generate electromagnetic radiation ("EMR"). The EMR may be generated as a by-product of operation of the electrical components of the communication module. Due to the rapidly changing signals involved in high-speed data communication, EMR generation may be a particularly high in communication modules included in high-speed data applications such as high-speed data networks.

Unintentionally generated and introduced EMR, can interrupt, obstruct, or otherwise degrade or limit the effective performance of a communication module or other nearby electronic circuits. For example, EMR may cause unwanted signals, also referred to as electromagnetic interference ("EMI") or noise, to be induced into electronic circuitry or other electronic components of the communication module.

The subject matter claimed herein is not limited to embodiments that solve any disadvantages or that operate only in environments such as those described above. Rather, this background is only provided to illustrate one exemplary technology area where some embodiments described herein may be practiced.

SUMMARY OF SOME EXAMPLE EMBODIMENTS

Some embodiments described herein relate generally to electromagnetic radiation ("EMR") control in communication modules. More particularly, example embodiments relate to EMR dissipating devices that may contain and/or dissipate EMR introduced into an electrical circuit.

In one example embodiment, an electrical circuit including an EMR source configured to generate an output signal at an operating bit rate. The output signal may include an EMR component. The electrical circuit may also include an EMR dissipating device electrically coupled to the EMR source and configured to have a resonance frequency corresponding to the operating bit rate.

In another example embodiment, an EMR dissipating device includes an electrical circuit electrically coupled to an EMR source. The electrical circuit includes a capacitive component, an inductive component, a resistive component, and a tuning component, which can vary the resonance frequency of the electrical circuit.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features and advantages of the invention will be set forth in the description, which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other features of the present invention, some embodiments of the invention will be illustrated in the appended drawings. It is appreciated that these drawings depict only some embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Some embodiments described herein relate generally to electromagnetic radiation ("EMR") control in communication modules. More particularly, example embodiments relate to EMR dissipating devices that may contain and/or dissipate EMR introduced into an electrical circuit. By containing and/or dissipating EMR, communication modules may reduce electromagnetic interference ("EMI").

Example Operating Environment

Embodiments described herein may be implemented in optoelectronic devices. As used herein, the term "optoelectronic device" includes a device having both optical and electrical components. Examples of optoelectronic devices include, but are not limited to transponders, transceivers, transmitters, or receivers. While some embodiments described herein will be discussed in the context of a transceiver module, those of skill in the art will recognize that the principles of the present invention may be implemented in virtually any device having some or all of the functionality described below.

Figure 1A:
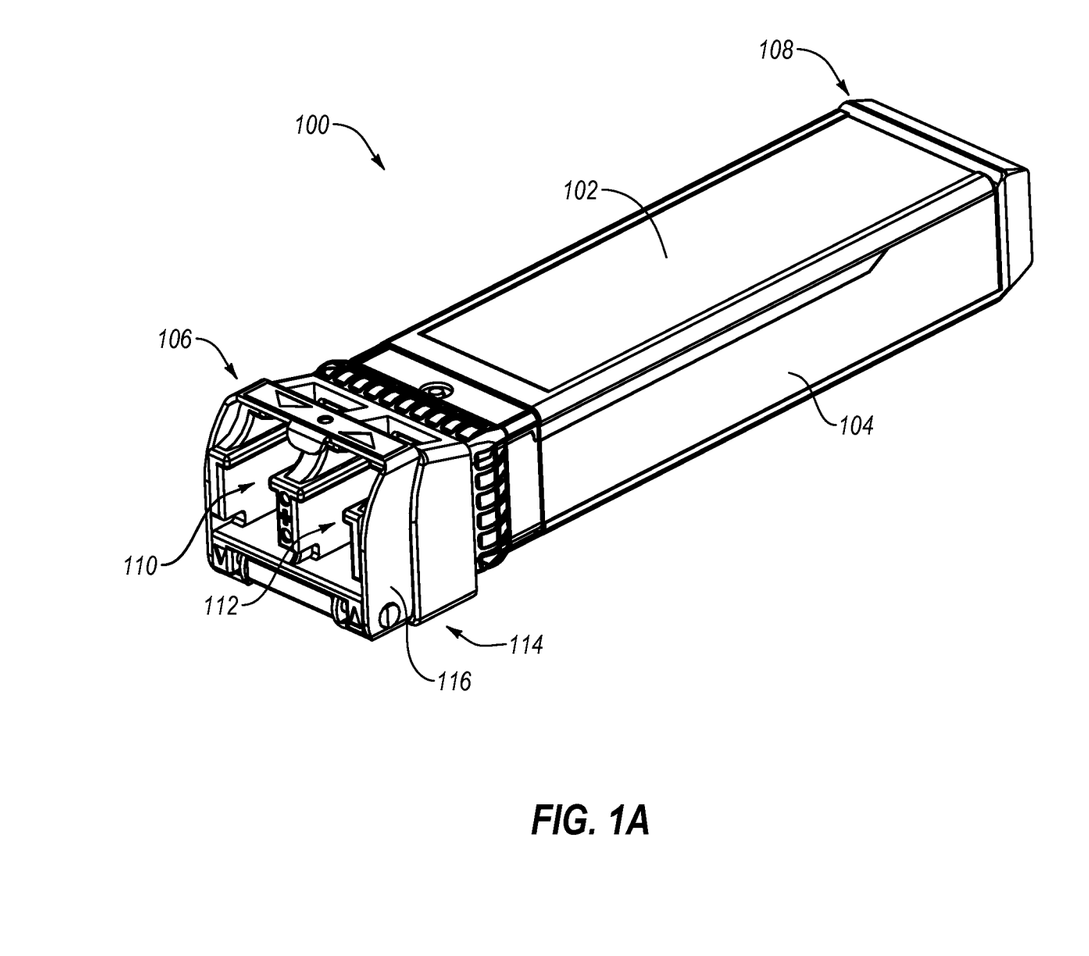
FIG. 1A is a perspective view of an example optoelectronic transceiver module in which an example EMR dissipating device may be implemented.

FIG. 1A illustrates a perspective view of an example optoelectronic transceiver module generally designated as transceiver 100 in which an EMR dissipating device may be implemented. The transceiver 100 may be an SFP+ optical transceiver in some embodiments. While described in some detail herein, the transceiver 100 is discussed by way of illustration only, and not by way of restricting the scope of the invention. For example, although the transceiver 100 may be an SFP+ optical transceiver in some embodiments, the principles of the invention may be implemented in optoelectronic modules of any form factor such as XFP, SFP, SFP+, SFF, XENPAK, and XPAK, without restriction. Additionally, the transceiver 100 may be suitable for optical signal transmission and reception at a variety of per-second data rates, including but not limited to, 1 Gbit, 2 Gbit, 4 Gbit, 8 Gbit, 10 Gbit, 14 Gbit, 20 Gbit or higher. Furthermore, optoelectronic modules of other types and configurations, or having components that differ in some respects from those shown and described herein, may also benefit from the principles disclosed herein.

As shown in FIG. 1A, the transceiver 100 includes a body composed of a top shell 102 and a bottom shell 104. The bottom shell 104 defines a front end 106 and a back end 108 of the transceiver 100. Included on the front end 106 of the transceiver 100 are two fiber ports 110 and 112 configured to receive connectors of an optical fiber (not shown). The two fiber ports 110 and 112 include an output fiber port 110 and an input fiber port 112. The fiber ports 110 and 112 define a portion of an interface portion 114 that is generally included on the front end 106 of the transceiver 100. The interface portion 114 may include structures to operably connect the transceiver 100 to optical fibers or optical fiber connectors such as, but not limited to, LC connectors.

Also disposed on the front end 106 of the transceiver 100 is a bail latch assembly 116 that enables the transceiver 100 to be removably secured in a host device (not shown). The body of the transceiver 100, including the top shell 102 and the bottom shell 104, may be formed of metal. In addition, the host device may include a cage (not shown) in which the transceiver 100 is inserted.

Figure 1B:
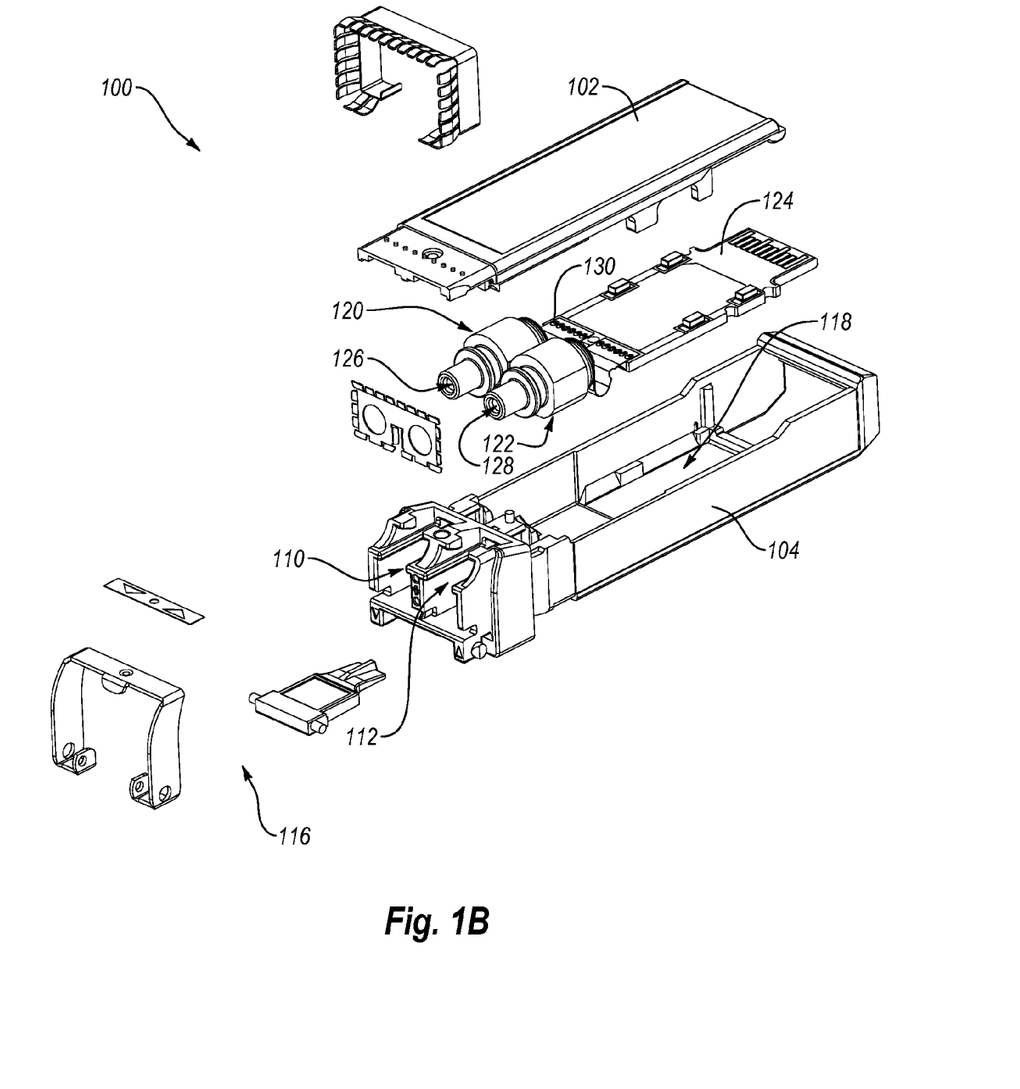
FIG. 1B is an exploded perspective view of the example transceiver module of FIG. 1A.

FIG. 1B illustrates an exploded perspective view of the transceiver 100 of FIG. 1A in which an EMR dissipating device may be implemented. In FIG. 1B, the bottom shell 104 defines a cavity 118 in which a TOSA 120, a ROSA 122, a printed circuit board ("PCB") 124, and PCB connectors 130 are positioned as internal components of the transceiver 100.

Each of the TOSA 120 and the ROSA 122 includes a fiber receiver 126 and 128, respectively, that extends into a respective one of the fiber ports 110 and 112. Positioned within the respective fiber ports 110 and 112, the fiber receivers 126 and 128 can mate with an optical fiber (not shown) or a connector portion (not shown) of the optical fiber when received within the fiber ports 110 and 112. The TOSA 120 and the ROSA 122 may be electrically coupled to the PCB 124 via the PCB electric connectors 130. The PCB electric connectors 130 may be configured as flexible circuit connectors or equivalent electrical contact(s) that allow the transmission of electrical signals between the PCB 124 and the TOSA 120/ROSA 122.

During operation, the transceiver 100 may receive a data-carrying electrical signal from a host device, which may be any computing system capable of communicating with the transceiver 100, for transmission as a data-carrying optical signal on to an optical fiber. The electrical signal may be provided to an optical transmitter, such as a laser disposed within the TOSA 120, which converts the electrical signal into a data-carrying optical signal for transmission on to an optical fiber and transmission via an optical communication network, for instance. The optical transmitter may include an edge-emitting laser diode, a Fabry-Perot ("FP") laser, a vertical cavity surface emitting laser ("VCSEL"), a distributed feedback ("DFB") laser, or other suitable light source. Accordingly, the TOSA 120 may serve or include components that serve as an electro-optic transducer.

In addition, the transceiver 100 may receive a data-carrying optical signal from an optical fiber via the ROSA 122. The ROSA 122 may include an optical receiver, such as a PIN photodiode, an avalanche photodiode ("APD"), or other suitable receiver, which transforms the received optical signal into a data-carrying electrical signal. Accordingly, the ROSA 122 may serve or include components that serve as an opto-electric transducer. The resulting electrical signal may then be provided to the host device in which the transceiver 100 is located.

Electrical Circuit Block Diagram

Figure 2:
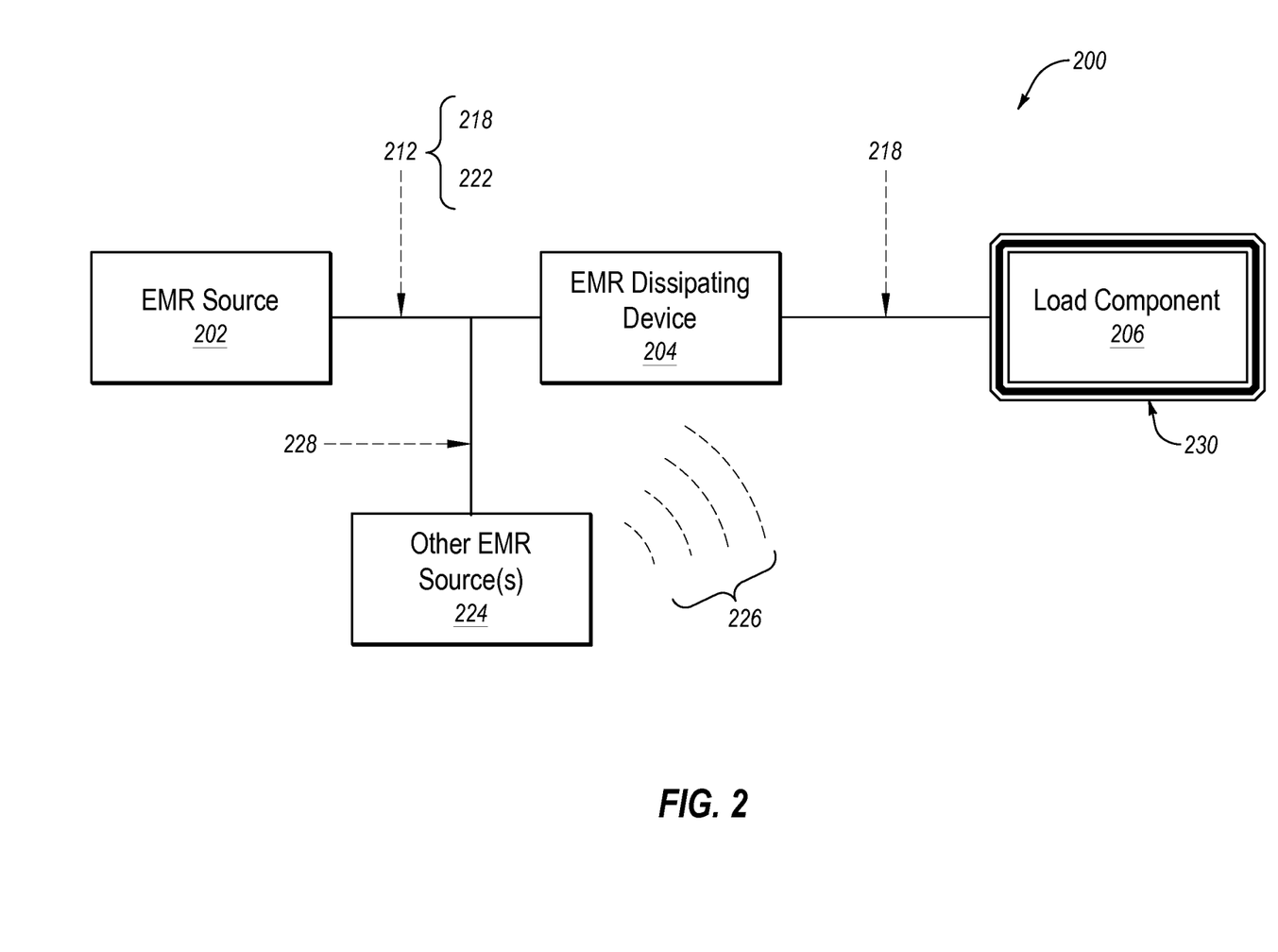
FIG. 2 is a block diagram of an example electrical circuit implementing an example EMR dissipating device.

FIG. 2 illustrates a block diagram of an example electrical circuit 200 implementing an example EMR dissipating device 204. The electrical circuit 200 may include an EMR source 202 communicatively coupled to a load component 206. The EMR source 202 may perform some function with respect to the load component 206. The function performed by the EMR source 202 may include driving, operating, activating, or amplifying a signal related to the load component 206, for instance. The communicative coupling between the EMR source 202 and the load component 206 may include electrical wiring or conductive etching, for instance.

The EMR source 202 may generate and/or communicate an output signal 212 at an operating bit rate. Note, referring to FIGS. 2-4, a dashed arrow pointing to a portion, a segment, or a leg of the diagram indicates a signal or component thereof included on that portion, segment, or leg. For example, referring to FIG. 2, the output signal 212 is included on the segment of the electrical circuit 200 between the EMR source 202 and the EMR dissipating device 204.

Similar to the EMR source 202, the load component 206 may receive and/or process the output signal 212 at an operating bit rate. As used herein, the operating bit rate relates to the number of bits that are communicated, generated, processed, or some combination thereof per unit of time in gigahertz ("GHz"). The load component 206 and/or the EMR source 202 may be designed to function at particular operating bit rates. Accordingly, the EMR source 202 may function at an operating bit rate related to an operating bit rate of the load component 206 or vice versa.

For example, the EMR source 202 may be a laser driver and the load component 206 may be an optical transmitter. The optical transmitter may be designed to transmit data at an operating bit rate of about 20 GHz. Accordingly, in this and other embodiments, the laser driver may generate a driving signal at an operating bit rate of about 20 GHz.

Alternatively, the EMR source 202 may include a differential optical transmitter, a receiver output driver, a transimpedance amplifier ("TIA"), or some combination thereof. The load component 206 may include an electrical and/or optical component such as, but not limited to, a PCB; a microprocessor; an optical receiver; or an optical transmitter such as edge-emitting laser diode, a FP laser, VCSEL, or a DFB laser.

The output signal 212 generated and/or communicated by the EMR source 202 may include a data component 218 and an EMR component 222. The data component 218 may be, for example, a portion of the output signal 212 by which the EMR source 202 drives, operates, activates, or amplifies a signal related to the load component 206. The data component 218 may relate to an ideal, a theoretical, preferred, or a modeled signal, for instance. For example, in embodiments in which the EMR source 202 is a laser driver and the load component 206 is optical transmitter, the data component 218 may be the driving signal communicated from the laser driver to the optical transmitter.

The EMR component 222 may be a portion of the output signal 212 generated and/or communicated by the EMR source 202 that is unintentional. Specifically, the EMR component 222 may be an unintentional result of the EMR source 202 generating and/or communicating the data component 218 of the output signal 212. For example, the EMR component 222 may result from rapidly changing electrical current or asymmetric waveforms in the EMR source 202 during the generation and/or communication of the output signal 212.

In this way, the EMR source 202 may introduce an output signal 212 including the EMR component 222 into the electrical circuit 200. Additionally, in some embodiments, because the manner the EMR component 222 is generated, the frequency of the EMR component 222 may correspond to the operating bit rate of the EMR source 202.

The EMR dissipating device 204 is communicatively coupled to the EMR source 202 and the load component 206. In some embodiments, the EMR dissipating device 204 receives the output signal 212 or some portion thereof and may dissipate some portion of the EMR component 222 leaving only the data component 218 or at least a closer approximation of the data component 218. Therefore, the load component 206 may receive a closer approximation of the data component 218 rather than the output signal 212 including the EMR component 222.

Without the EMR dissipating device 204, the EMR component 222 portion of the output signal 212 may be received by the load component 206. In this and other configurations, the load component 206 may not operate properly, or at all, because the output signal 212 received by the load component 206 may be a combination of the data component 218 and the EMR component 222. The EMR component 222 portion of the output signal 212 may degrade the data component 218 or may potentially result in electromagnetic interference ("EMI") which is often characterized by a loss of data, excessive noise, or crosstalk, for instance.

In contrast, with the EMR dissipating device 204, the output signal 212 or some portion thereof may be communicated to the EMR dissipating device 204 rather than being communicated directly to, and received directly by, the load component 206.

It should be appreciated, that in some embodiments or under some operating conditions, the EMR dissipating device 204 may only dissipate some portion of the EMR component 222 due to actual losses attributed to internal inefficiencies, for instance. Nevertheless, the principle that the EMR dissipating device 204 receives the output signal 212 and dissipates the EMR component 222 leaving only the data component 218 in the electrical circuit 200 to be received by the load component 206 is illustrated in FIG. 2.

The EMR dissipating device 204 may operate by filtering and/or trapping the energy of the EMR component 222. That is, the EMR dissipating device 204 may confine the EMR component 222 to the EMR dissipating device 204 where the EMR component 222 is dissipated. To this end, the EMR dissipating device 204 may include a resonance frequency corresponding to the operating bit rate of the EMR source 202. The EMR dissipating device 204 may therefore be focused on filtering and/or trapping of the EMR component 222.

For example, in some embodiments, the EMR component 222 may result from the EMR source 202 generating and/or communicating an output signal 212 at the specific operating bit rate of about 20 GHz. In this and other embodiments, the EMR dissipating device 204 may include one or more components configured such that the resonance frequency of the EMR dissipating device 204 is also about 20 GHz.

Generally, the resonance frequency of the EMR dissipating device 204 may match the operating bit rate of the EMR source 202. That is, as the above example, when the operating bit rate of the EMR source 202 is about 20 GHz, the resonance frequency may be about 20 GHz. Alternatively, the resonance frequency of the EMR dissipating device 204 may be a multiple of the operating bit rate of the EMR source 202. For example if the operating bit rate of the EMR source is about 20 GHz, the resonance frequency of the EMR dissipating device 204 may be about 40 GHz, about 60 GHz, etc.

In the embodiment depicted in FIG. 2, the electrical circuit 200 includes one EMR source 202, one EMR dissipating device 204, and one load component 206. This depiction is not meant to be limiting. In some embodiments, the electrical circuit 200 may include additional EMR sources 202, load components 206, EMR dissipating devices 204, or combination thereof. Additionally, the additional EMR sources 202 may generate additional output signals 212 that may or may not include the EMR component 222.

In some embodiments, other EMR source(s) 224 may exist in the electrical circuit 200 or may exist external to the electrical circuit 200 such as on a remote device for instance. The other EMR sources 224 may generate and/or communicate conducted EMR 228 and/or radiated EMR 226. Accordingly, in this and other embodiment, the electrical circuit 200 may include various EMR compensation mechanisms and/or multiple EMR dissipating devices 204. The EMR compensation mechanisms may include EMR shielding 230 that may create a physical barrier between the radiated EMR 226 and one or more load components 206. Additionally or alternatively, the electrical circuit 200 may include EMR compensation mechanisms that modify or otherwise reduce the generation and/or communication of conducted EMR 228 from the other EMR source(s) 224. The EMR compensation mechanisms may include decoupled filters, balancing differential signals, or physically separating the other EMR source(s) 224 from the electrical circuit 200.

Additionally or alternatively, the EMR dissipating device 204 may be adapted to compensate for the conducted EMR 228 and/or the radiated EMR 226. That is, in some embodiments, the electrical circuit 200 may include shielding 230 and adapt the EMR dissipating device 204 to dissipate the EMR component 222 from the EMR source 202 as well as the conducted EMR 228 from the other EMR source(s) 224.

Additionally, the EMR dissipating device 204 may be integrated into the same die and/or the same integrated circuit ("IC") as the EMR source 202 and/or the load component 206. In some embodiments, the electrical circuit 200 may be integrated into an IC, a flexible circuit, a conductive network, a printed circuit assembly, or any combination thereof. For example, a TOSA, a PCB, a ROSA, or some combination thereof of a transceiver module, may include the electrical circuit 200. Specifically, the electrical circuit 200 may be implemented into the PCB 124, the ROSA 122, the TOSA 120 or some combination thereof of the transceiver 100 of FIGS. 1A and 1B.

Alternatively, the electrical circuit 200 may be incorporated in a larger electrical structure, which may include additional or alternative circuitry, apparatuses, mechanisms, components, arrangements, etc. In some embodiments, the electrical circuit 200 may be duplicated one or more times in a larger electrical structure.

Alternatively, the EMR dissipating device 204 may be located remotely with respect to the EMR source 202 and/or load component 206, such as outside, adjacent to, or external to a component including the EMR source 202 and/or load component 206. For example, the EMR dissipating device 204 may located remotely in circumstances were space or size is relatively limited. Alternatively still, some subset of components included in the EMR dissipating device 204 may be incorporated in the same die and/or IC as the EMR source 202 and/or load component 206 while other components included in the EMR dissipating device 204 may be located remotely.

EMR Dissipating Device Example Embodiment

Figure 3:
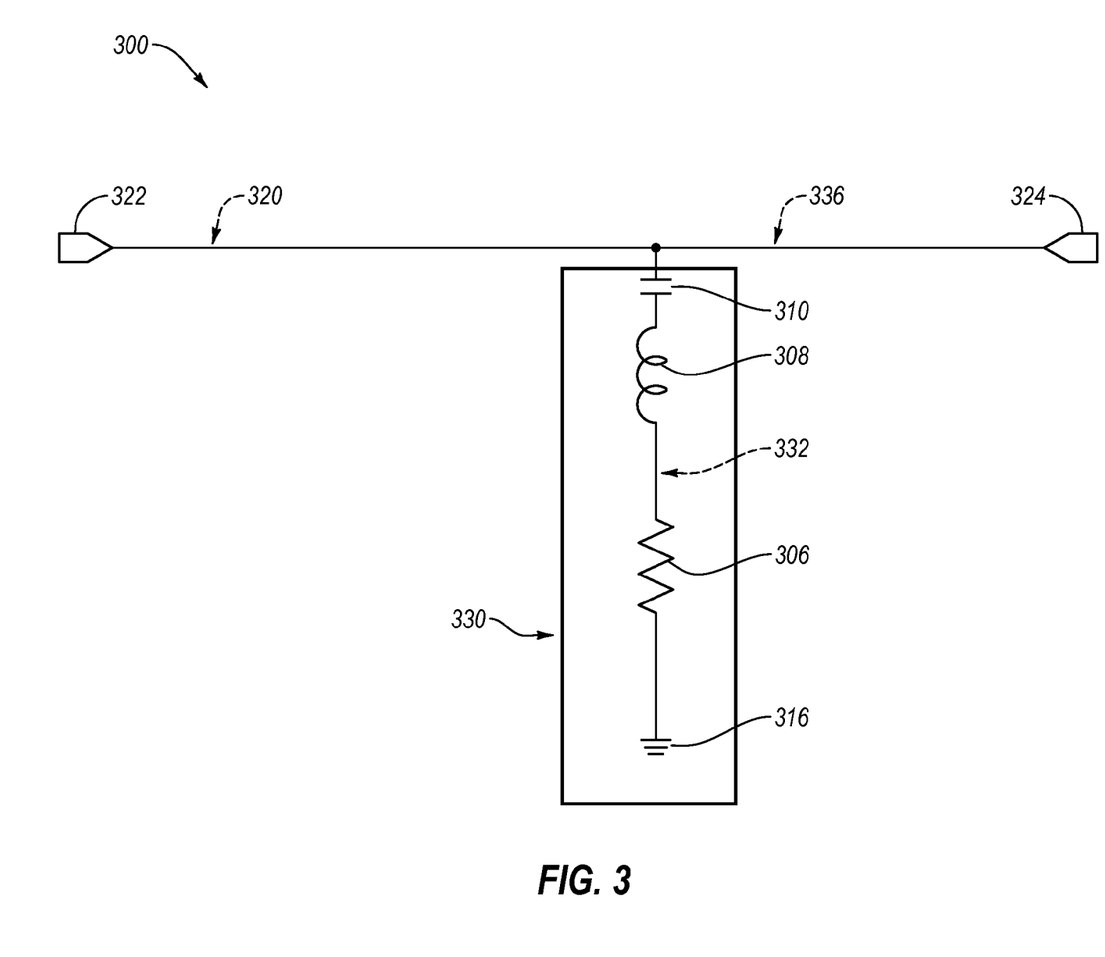
FIG. 3 is an example EMR dissipating device that may be included in the electrical circuit of FIG. 2.

FIG. 3 illustrates an example EMR dissipating device 300 that may be included in the electrical circuit 200 depicted in FIG. 2. The EMR dissipating device 300 may include one or more components to dissipate an EMR component included in an input signal 320.

The EMR dissipating device 300 may include a resistor-inductor-capacitor ("RLC") circuit 330. The RLC circuit 330 may include a ground 316, a capacitive component 310, an inductive component 308, and a resistive component 306, which may be electrically coupled in series. In FIG. 3, the capacitive component 310, the inductive component 308, and the resistive component 306 are depicted as independent components. However, it is understood that the capacitive component 310, the inductive component 308, and the resistive component 306 may independently include and/or share one or more components, structures, mechanisms, or some combination thereof.

With combined reference to FIGS. 2 and 3, the output signal 212 of the EMR source 202 may be the input signal 320. That is, similar to the output signal 212 discussed above, the input signal 320 may include the data component 218 and the EMR component 222. Additionally, similar to the output signal 212, the input signal 320 may include the EMR component 222 that corresponds to the operating bit rate of the EMR source 202.

The input signal 320 including an EMR component may enter the RLC circuit 330 and thereby may be converted to an oscillating signal 332. The oscillating signal 332 may oscillate between an electric field created by the capacitive component 310 and a magnetic field created in the inductive component 308. During the oscillation, the EMR component of the oscillating signal 332 may be dissipated through the resistive component 306. That is, the EMR dissipating device 300 may operate by confining and dissipating the EMR component of the oscillating signal 332 in the RLC circuit 330.

The RLC circuit 330 may have a particular resonance frequency. Generally, the resonance frequency, as referred to herein, is the frequency at which the imaginary impedance of the RLC circuit 330 is at a minimum as seen by the input signal 320. At the resonance frequency, the total complex impedance is a real resistive value.

The resonance frequency of the RLC circuit 330 may be controlled through selection and/or variation the capacitive component 310 and/or the inductive component 308. That is, the resonance frequency of the RLC circuit 330 may be determined by the capacitive component 310 and inductive component 308 included in the RLC circuit 330. Additionally, the resonance frequency of the RLC circuit 330 may be based upon the operating bit rate of an EMR source generating and/or communicating the input signal 320.

The correspondency between the resonance frequency of the RLC circuit 330 and the operating bit rate of the EMR source 202 may maximize dissipation of the EMR component of the input signal 320 through the RLC circuit 330. As used with reference to the RLC circuit 330, the correspondency between resonance frequency and an operating bit rate, may mean for example, that the resonance frequency of the RLC circuit 330 matches an operating bit rate of an EMR source. The correspondency between resonance frequency and an operating bit rate may alternatively mean that the resonance frequency of the RLC circuit 330 may be a multiple of an operating bit rate of an EMR source as described above.

A result of the RLC circuit 330 may be a filtered signal 336. The filtered signal 336 may include the portions of the input signal 320 not filtered by the RLC circuit 330. With combined reference to FIGS. 2 and 3, the filtered signal 336 may be the data component 218 which may drive, operate, activate, or amplify a signal related to the load component 206.

The RLC circuit 330 may be included in an IC that may be incorporated in a device such as PCB, a TOSA, or a ROSA, for instance. Alternatively, one or more of the ground 316, the capacitive component 310, the inductive component 308, and the resistive component 306 may be located remotely. That is, one or more of the ground 316, the capacitive component 310, the inductive component 308, or the resistive component 306 may integrated into the IC while others may be located outside, adjacent to, or external to the IC. Accordingly, any or all of the ground 316, the capacitive component 310, the inductive component 308, and the resistive component 306 may be formed through metalizing a pattern on an insulating substrate during IC construction. Additionally or alternatively, each of the ground 316, the capacitive component 310, the inductive component 308, and the resistive component 306 may take the form of a macroscopic, independent device structure. For example, the capacitive component 310 may include a dielectric-dual plate capacitor, a ceramic disk, a multilayer polyester film, a tubular ceramic, a paper capacitor, a PET film capacitor, etc. Similarly, the inductive component 308 may include a cylindrical air-core coil, a straight wire conductor, etc.

EMR Dissipating Device Example Embodiment

Figure 4:
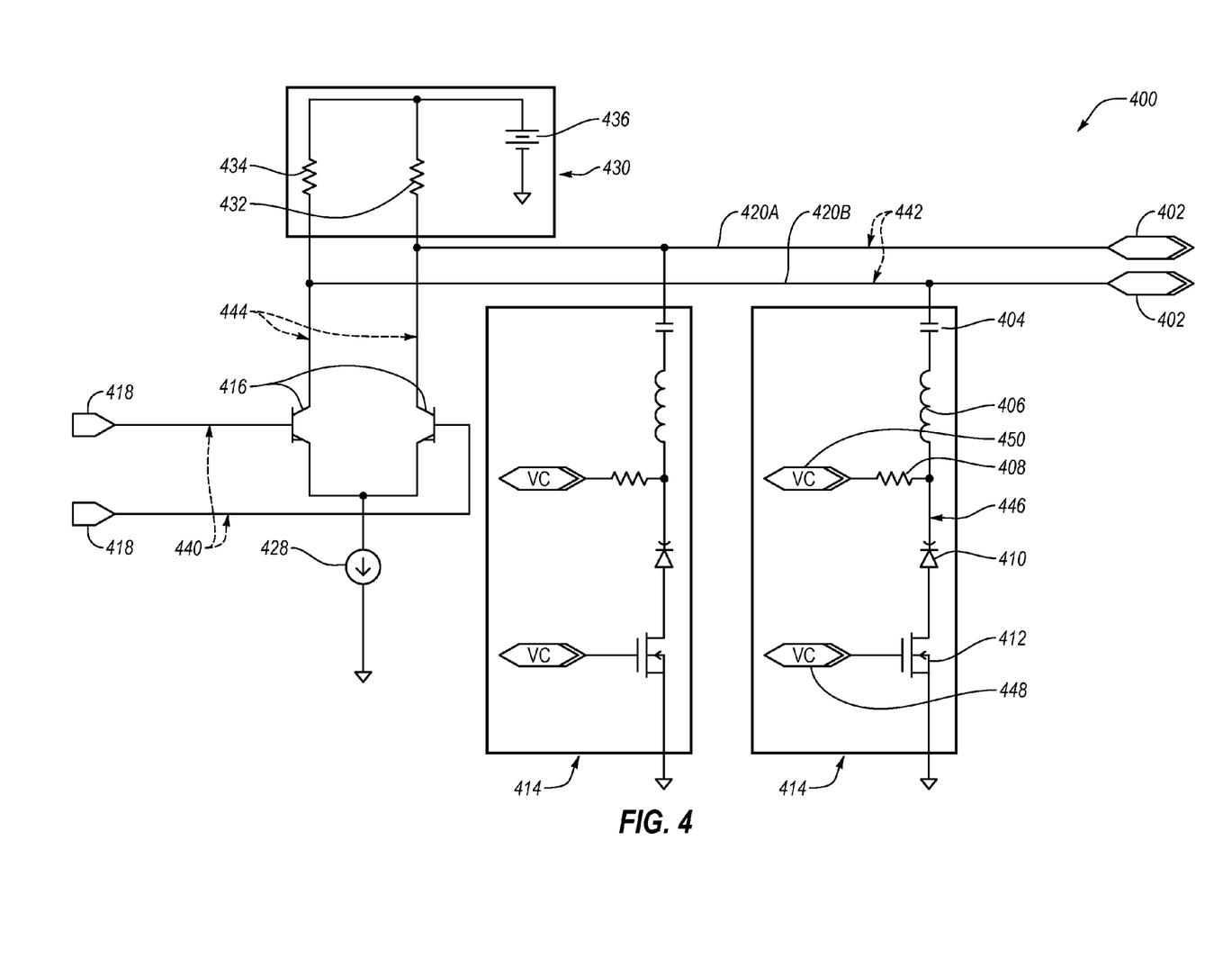
FIG. 4 is an example differential EMR dissipating device that may be included in the electrical circuit of FIG. 2.

FIG. 4 illustrates an example differential EMR dissipating device 400 that may be included in an electrical circuit such as the electrical circuit 200 of FIG. 2. The differential EMR dissipating device 400 may receive a differential input signal 440 including an EMR component. The EMR component of the differential input signal 440 may be dissipated through augmented RLC circuits 414, leaving a filtered differential signal 442. The filtered differential signal 442 may be communicated to a load component through output ports 402. Broadly, the differential EMR dissipating device 400 may include two legs 420A and 420B which may be configured in parallel. The two legs 420A and 420B extend from the input ports 418 to the output ports 402. Each of the two legs 420A and 420B may include one or more input transistors 416 and one or more augmented RLC circuits 414. In the depicted embodiment, each leg 420A and 420B includes one input transistor 416 and one augmented RLC circuit 414 which are identical. However, in some embodiments, inclusion of the input transistors 416 and/or the augmented RLC circuits 414 may vary between the legs 420A and 420B. That is, in some embodiments, a first leg 420A or a second leg 420B may include a different input transistor 416 and/or augmented RLC circuit 414 and/or omit the input transistor 416 and/or the augmented RLC circuit 414 or some portion thereof.

The differential input signal 440 may enter the differential EMR dissipating device 400 through inputs ports 418. The input ports 418 may be a connection between an EMR source and the differential EMR dissipating device 400. In some embodiments, the input ports 418 may be connected to an EMR source where the differential input signal 440 that may include an output signal including an EMR component is generated. For example, the input ports 418 may be connected to an output stage of a differential laser driver because the generation of EMR may occur at the output stage due to waveform asymmetry. Alternatively, the input ports 418 may be connected to the EMR source based on convenience and/or other circuit design criteria, for instance.

FIG. 4 depicts a potential electrical configuration for the input transistors 416. In this and other electrical configurations, the input ports 418 may be operably coupled to the bases of the input transistors 416. Therefore, the input differential signal 440 may be applied to the bases of the input transistor 416. The collector supply 430 may be electrically coupled to the collector of the input transistors 416. The collector supply 430 may include two resistors 434 and 432 that may provide resistance to a constant voltage source 436. The resistors 434 and 432 may have identical resistances or alternatively have differing resistances. The emitters of the input transistors 416 may be electrically coupled to a constant current source 428. The particular electrical configuration of the input transistors 416 may vary depending on the type of input transistors 416, for instance.

The input transistors 416 may include any transistor or amplification component that may amplify, modulate, switch, limit, vary, convert, or otherwise modify the differential input signal 440. Additionally, the input transistors 416 may include multiple amplification components such as a series of transistors or operational amplifiers, for instance. In some embodiments, the input transistors 416 included on the two legs 420A and 420B may create a current mirror.

The augmented RLC circuits 414 may be operably connected to an output of the input transistors 416. The augmented RLC circuits 414 may include a capacitive component 404, an inductive component 406, and a resistive component 408. The capacitive component 404, the inductive component 406, and the resistive component 408 are largely identical to the capacitive component 310, the inductive component 308, and the resistive component 306 discussed in connection with FIG. 3. Notably the augmented RLC circuits 414 are described herein with respect to the differential EMR dissipating device 400. However, the augmented RLC circuit 414 or variations thereof are not limited to this application. That is, the augmented RLC circuit 414 may be implemented in the EMR dissipating device 300 illustrated in FIG. 3, for instance.

The augmented RLC circuit 414 may include a tuning component 410. Without the tuning component 410, the capacitance of the augmented RLC circuit 414 may be a static capacitance created by the capacitive component 404. However, the inclusion of the tuning component 410 may allow variation in a capacitance of the augmented RLC circuit 414. Additionally, by varying the capacitance of the augmented RLC circuit 414, a resonance frequency of the augmented RLC circuit 414 may correspondingly vary. Thus, the inclusion of the tuning component 410 may allow the augmented RLC circuit 414 to adapt or be modified to correspond to a particular operating bit rate of an EMR source.

Some example tuning components 410 might include a varactor, a mechanically, electrically, or digitally variable capacitor, or some combination thereof. Specifically, in some embodiments, the tuning component 410 may be the varactor which is a diode that includes terminals. The capacitance of the varactor may vary as a function of voltage on the terminals. Accordingly, in these and other embodiments, the RLC circuit 414 may include tuning component voltage source 450. The tuning component voltage source 450 may supply a variable voltage to the RLC circuit 414. As the voltage supplied by the tuning component voltage source 450 changes, the capacitance of the varactor changes. Additionally or alternatively, the tuning component 410 may include a variable inductor, which may vary the resonance frequency by controlling the inductance of the augmented RLC circuit 414.

The augmented RLC circuit 414 may also include a switch component (not shown). The switch component may allow and/or disallow operation of the augmented RLC circuit 414 within the differential EMR dissipating device 400. That is, when the switch is open, a resistance in the augmented RLC circuit 414 may be infinite, thereby eliminating or reducing substantially the introduction of electrical signals into the augmented RLC circuit 414. The switch component may include a relay, a transistor, a logic gate, for example.

The augmented RLC circuit 414 may also include the variable resistive component (not shown). Without the variable resistive component, the resistance of the augmented RLC circuit 414 may be a static resistance created by the resistive component 408. However, the inclusion of the variable resistive component may allow variation in a resistance of the augmented RLC circuit 414. Additionally, by varying the resistance of the augmented RLC circuit 414, an electrical damping behavior of the augmented RLC circuit 414 may correspondingly vary. The electrical damping behavior is sometimes described by a "Q factor." The Q factor is the ratio of the maximum energy stored in a circuit to the average energy dissipated in the circuit per cycle at resonance. Thus, the inclusion of the variable resistive component may allow the augmented RLC circuit 414 to vary the Q factor. Thus the augmented RLC circuit 414 may include a capacity to adapt or be modified to electrically damp a particular EMR component of the differential input signal 440. The variable resistive component might include a potentiometer, rheostat, or a MOSFET, for example.

In the depicted embodiment, the switch component and the variable resistive component are both included in a MOSFET 412. In this and other embodiments, the MOSFET 412 may be configured as a variable resistor by the inclusion of the MOSFET control voltage supply 448. The MOSFET control voltage supply 448 changes the resistance between a drain and a source of the MOSFET 412.

Additionally, the MOSFET 412 is configured as the switch component in the differential EMR dissipating device 400. That is, when the MOSFET 412 is off, the augmented RLC circuit 414 will be open thereby eliminating or reducing substantially the introduction of electrical signals into the augmented RLC circuit 414. Thus, the MOSFET 412 may vary the resistance of the augmented RLC circuit 414 as well as may allow and/or disallow operation of the augmented RLC circuit 414.

Some details of the augmented RLC circuits 414 are discussed above implying that the two augmented RLC circuits 414 illustrated in FIG. 4 are identical. However, the above description is not limiting. Some or all the components, mechanisms, and devices are not necessary shared by the two legs 420A and 420B of the differential EMR dissipating device 400. One or more augmented RLC circuit 414 components (that is, the capacitive component 404, the inductive component 406, the resistive component 408, the tuning component 410, the switch component, the MOSFET control voltage supply 448, tuning component voltage source 450, and the variable resistive component) may vary between the two legs 420A and 420B or may be omitted in one or both of the two legs 420A and 420B. Additionally, the augmented RLC circuits may include additional components and functions not explicitly recited herein.

The output ports 402 may be a connection between the differential EMR dissipating device 400 and a load component. The output ports 402 may, for example, connect to a circuit such that the input differential signal 440 or some variation thereof may drive, operate, activate, or amplify the load component.

Functionally, the differential input signal 440 may enter the differential EMR dissipating device 400 through inputs ports 418 then precede through the input transistors 416. The input transistors 416 may output a modified differential signal 444. The modified differential signal 444 may include some representation of the input differential signal 440 following a set or series of operations performed on the input differential signals 440 by the input transistors 416. Specifically, the modified differential signal 444 may include a modified EMR component which may be representative of the EMR component included in the input differential signal 440. In some embodiments, the input transistors 416 may not be identical, thus in these and other embodiments, the modified differential signals 444 may vary between the two legs 420A and 420B.

The modified differential signal 444 that may include the modified EMR component or some portion thereof may enter the augmented RLC circuits 414. The modified differential signal 444 that enters the augmented RLC circuits 414 may be converted to an oscillating differential signal 446 which may include the modified EMR component. The oscillating differential signal 446 may oscillate between an electric field created by the capacitive component 404 and/or the tuning component 410 and a magnetic field created in the inductive component 406. During the oscillation, the modified EMR component of the oscillating differential signal 446 may be dissipated through the resistive component 408 and/or the variable resistive component 412. That is, the differential EMR dissipating device 400 may operate by confining the oscillating differential signal 446 to the augmented RLC circuit 414 where the oscillating differential signal 446 may oscillate until the EMR component of the oscillating differential EMR signal 446 is dissipated.

The augmented RLC circuit 414 may have a resonance frequency that may be set and/or controlled through selection and/or variation of the capacitive component 404 and/or the inductive component 406 and may be varied through manipulation of the tuning component 410. As with the resonance frequency of the RLC circuit 330 discussed above, the resonance frequency of the augmented RLC circuit 414 may correspond to the operating bit rate of an EMR source generating and/or communicating the input differential signal 440. The correspondency between the resonance frequency of the augmented RLC circuit 414 and the operating bit rate of the EMR source may maximize dissipation of the modified EMR component by the augmented RLC circuit 414.

The differential EMR dissipating device 400 may be included in electrical circuits including a differential signal source such as differential laser driver circuits, for instance. In some embodiments, the differential signal source and/or the differential EMR dissipating device 400 may be included in high-speed data communication modules that may be included in high-speed data communication networks. For example, the high-speed data communication modules may operate between about 0 GHz and about 30 GHz, however, this range is not limiting.

Like the EMR dissipating device 300, the differential EMR dissipating device 400 may be integrated in any integrated circuit ("IC"), flexible circuit, conductive network, printed circuit assembly. Alternatively, differential EMR dissipating device 400 may include components integrated in an IC and other components located remotely.

Simulated Circuit Data

Figure 5:
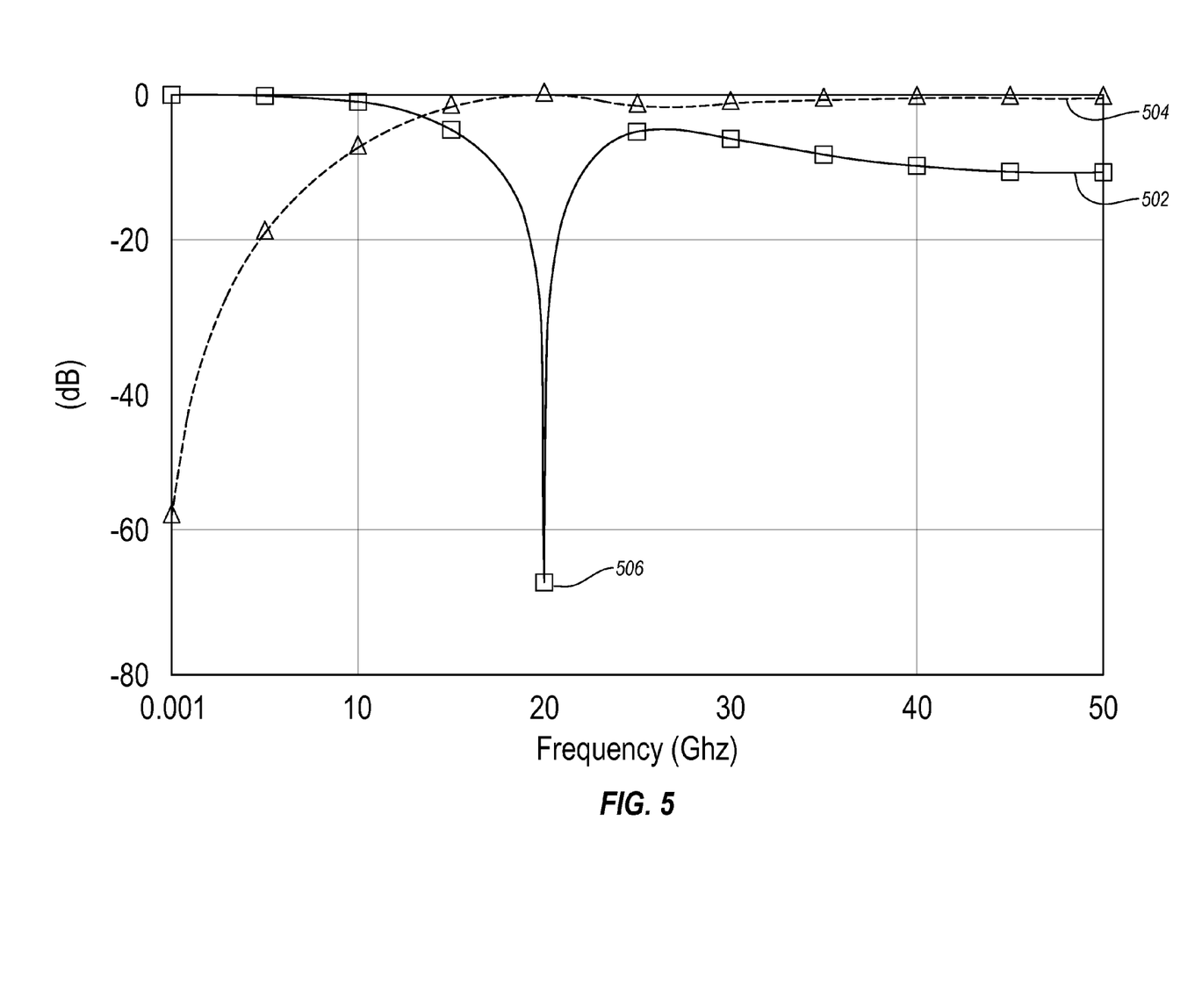
FIG. 5 is simulated scattering parameters of an example modeled amplifier that generates a simulated input signal transmitted through the EMR dissipating device of FIG. 3.
Figure 6:
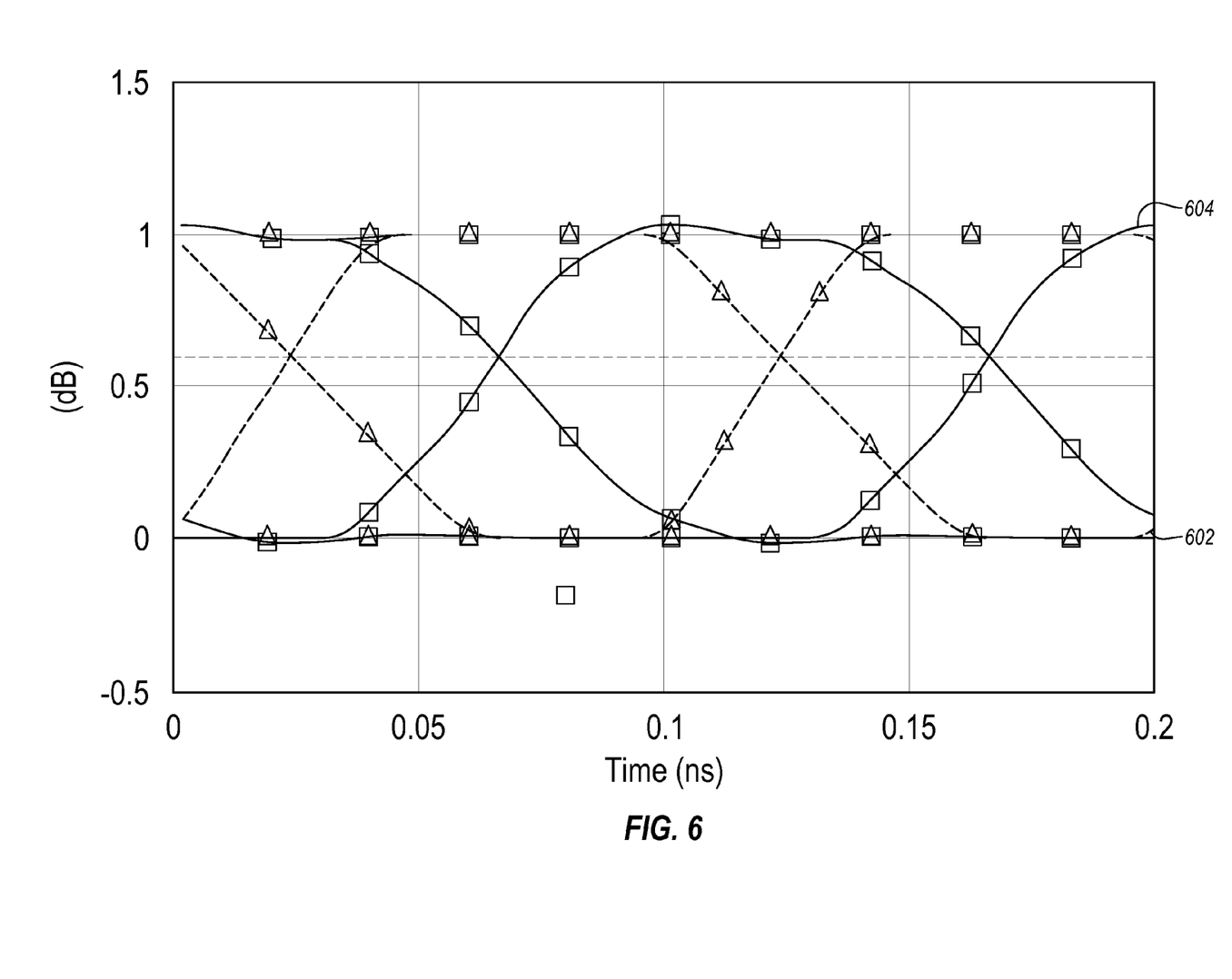
FIG. 6 is an eye diagram of a simulated input signal transmitted through the EMR dissipating device of FIG. 3.

With combined reference to FIGS. 2, 3, 5, and 6, the EMR dissipating device 300 may be modeled with a first port 322 and a second port 324. The first port 322 and the second port 324 may allow the acquisition of simulated data indicative of a performance of the EMR dissipating device 300. FIGS. 5 and 6 illustrate simulated data acquired from the EMR dissipation device 300 measured at the first port 322 and/or the second port 324. The input signal 320, which is simulated, is generated from the EMR source 202 having a variable operating bit rate. Thus, the frequency of the input signal 320 may vary. Additionally, the capacitive component 310 is modeled to have a capacitance of about 0.211 picofarad and the inductive component 308 is modeled to have an inductance of about 0.3 nanohenry making the resonance frequency of the RLC circuit 330 equal to about 20 GHz. Note, to calculate a resonance frequency of an RLC circuit, the following equation may be used:

$$f = 1/2\pi\sqrt{LC}$$

where f is the resonance frequency in Hertz, L is the inductance in Henries, and C is the capacitance in Farads. Additionally, for the simulations depicted in FIGS. 5 and 6, the EMR source 202 was a modeled amplifier. For example, the modeled amplifier may simulate a differential amplifier used to drive the load component 206.

Specifically, FIG. 5 depicts two simulated data signals illustrating scattering parameters, which is referred to herein as "S parameter", of the modeled amplifier. Generally, "scattering" refers to the affect an introduced network has on currents and voltages propagating along the transmission line. The magnitude of the S-parameter may be plotted in units of decibels ("dB") as a function of frequency in units of gigahertz ("GHz"). A first S-parameter signal 504 is the S-parameter data of the EMR dissipating device 300 acquired at the first port 322. The first S-parameter signal 504 may replicate the input signal 320 without the EMR dissipating device 300. The general behavior of the first S-parameter signal 504 indicates an increasing S-parameter magnitude with frequency that approaches an S-parameter magnitude of about 0 dB.

A second S-parameter signal 502 is also included in FIG. 5. The second S-parameter signal 502 may be acquired at the second port 324. The second S-parameter signal 502 illustrates an effect of the EMR dissipating device 300 on the S-parameter magnitude. As indicated by item 506, when the input signal has a frequency of about 20 GHz, the magnitude of the S-parameter is reduced. That is, when the input signal 320 frequency matches the resonance frequency of the RLC circuit 330 the magnitude of the S-parameter drops.

FIG. 6 depicts eye diagrams of a simulated input signal 320 transmitted through the EMR dissipating device 300. Generally, an eye diagram is a useful mathematical construct for assessing signal quality. Eye diagrams typically include thousands of individual bits overlapped in time to one bit period. FIG. 6 depicts a first simulated eye diagram 602 and a second simulated eye diagram 604. The first eye diagram 602 was acquired at the first port 322 and the second eye diagram 604 was acquired at the second port 324. As illustrated in FIG. 6 the presence of the RLC circuit 330 does not degrade the simulated input signal 320.

The present invention may be embodied in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An electrical circuit, comprising:
  an electromagnetic radiation ("EMR") source configured to generate an output signal at an operating bit rate, wherein the output signal includes an EMR component;

an EMR dissipating device electrically coupled to the EMR source, the EMR dissipating device includes a filter circuit electrically coupled to the EMR source, the filter circuit is configured to filter a portion of the EMR component of the output signal based on a resonance frequency of the filter circuit; and an output terminal configured to output the output signal after the output signal is filtered by the filter circuit, wherein the filter circuit includes:
  a capacitor circuit that includes a first capacitor terminal and a second capacitor terminal, the first capacitor terminal is coupled to the output terminal;
  an inductor circuit that includes a first inductor terminal and a second inductor terminal, the first inductor terminal is coupled to the second capacitor terminal;
  a varactor circuit that includes a first varactor terminal and a second varactor terminal, the first varactor terminal is coupled to the second inductor terminal; and
  a transistor circuit that includes a first transistor terminal, a second transistor terminal, and a third transistor terminal, the first transistor terminal is coupled to the second varactor terminal and the second transistor terminal is coupled to ground,
  wherein
    a first control voltage, applied to the third transistor terminal, varies a resistance of the filter circuit to adjust a Q factor and electrical damping behavior of the filter circuit, and
    a second control voltage, applied to the first varactor terminal and the second inductor terminal, varies a capacitance of the filter circuit to thereby adjust the resonance frequency of the filter circuit.

2. The electrical circuit of claim 1, wherein the output signal further includes a data component that is configured to activate a load component coupled to the output terminal.

3. The electrical circuit of claim 2, wherein the load component is an optical transmitter, a vertical cavity surface emitting laser, a distributed feedback laser, or an optical receiver.

4. The electrical circuit of claim 3, further comprising EMR shielding.

5. The electrical circuit of claim 1, wherein the transistor circuit is configured as a switch that is configured to electrically couple and decouple the EMR dissipating device to and from the EMR source.

6. An optical subassembly including the electrical circuit of claim 1.

7. The electrical circuit of claim 1, wherein the EMR source is located remotely with respect to the EMR dissipating device.

8. The electrical circuit of claim 1, wherein the EMR source is an output stage of a laser driver, a trans-impedance amplifier, or a receiver output driver.

9. The electrical circuit of claim 1, wherein the EMR source includes a differential output stage and the EMR dissipating device includes two filter circuits.

10. A circuit, comprising:
an EMR source configured to generate a signal at an operating bit rate, wherein the signal includes an EMR component and a data component;
an EMR dissipating device electrically coupled to the EMR source, the EMR dissipating device includes a filter circuit electrically coupled to the EMR source, the filter circuit is configured to filter a portion of the EMR component of the signal based on a resonance frequency of the filter circuit;
an output terminal configured to output the signal after the signal is filtered by the filter circuit; and
a drive circuit electrically coupled with the filter circuit and configured to drive the signal onto the output terminal, wherein the filter circuit includes:
  a first resistive component that includes a transistor that includes first, second, and third transistor terminals;
  a capacitive component that includes a capacitor that includes first and second capacitor terminals;
  an inductive component that includes an inductor that includes first and second inductor terminals; and
  a capacitive tuning component that includes a varactor that includes first and second varactor terminals,
  wherein
    the first capacitor terminal is coupled to the output terminal,
    the second capacitor terminal is coupled to the first inductor terminal,
    the second inductor terminal is coupled to the first varactor terminal,
    the second varactor terminal is coupled to the first transistor terminal,
    the second transistor terminal is coupled to ground,
    the third transistor terminal is coupled to a first control voltage, and
    the second inductor terminal and the first varactor terminal are coupled to a first resistive terminal of a second resistive component and a second resistive terminal of the second resistive component is coupled to a second control voltage,
  wherein adjusting the first control voltage varies a resistance of the filter circuit to adjust a Q factor and electrical damping behavior of the filter circuit, and
  wherein adjusting the second control voltage varies a capacitance of the filter circuit to thereby adjust the resonance frequency of the filter circuit.

11. The circuit of claim 10, wherein
the signal is a differential signal,
the drive circuit is a differential drive circuit configured to drive and amplify the differential signal,
the output terminal is a differential output terminal that includes a first output terminal and a second output terminal, and
the filter circuit is a first filter circuit electrically coupled between the first output terminal of the differential output terminal and ground,
wherein the EMR dissipating device further includes:
  a second filter circuit electrically coupled between the second output terminal of the differential output terminal and ground, wherein both the first and the second filter circuits are electrically coupled to the differential drive circuit to filter the portion of the EMR component of the differential signal.

12. The circuit of claim 10, wherein the data component of the signal activates a load component coupled to the output terminal.

13. The circuit of claim 12, wherein the load component is an optical transmitter, a vertical cavity surface emitting laser, a distributed feedback laser, or an optical receiver.

14. The circuit of claim 13, further comprising EMR shielding.

15. The circuit of claim 10, wherein the transistor is configured as a switch that is configured to electrically couple and decouple the EMR dissipating device to and from the EMR source.

16. An optical subassembly including the circuit of claim 10.

17. The circuit of claim 10, wherein the EMR source is located remotely with respect to the EMR dissipating device.

18. The circuit of claim 10, wherein the EMR source is an output stage of a laser driver, a trans-impedance amplifier, or a receiver output driver.

* * * * *